(12) United States Patent
Li et al.

(10) Patent No.: US 12,040,210 B2
(45) Date of Patent: Jul. 16, 2024

(54) MULTI-PRESSURE BIPOLAR ELECTROSTATIC CHUCKING

(71) Applicant: Applied Materials, Inc., Santa Clara, CA (US)

(72) Inventors: Jian Li, Fremont, CA (US); Dmitry A. Dzilno, Sunnyvale, CA (US); Juan Carlos Rocha-Alvarez, San Carlos, CA (US); Paul L. Brillhart, Pleasanton, CA (US); Akshay Gunaji, Bangalore (IN); Mayur Govind Kulkarni, Bangalore (IN); Sandeep Bindgi, Karnataka (IN); Sanjay Kamath, Fremont, CA (US); Kwangduk Douglas Lee, Redwood City, CA (US); Zongbin Wang, Singapore (SG); Yubin Zhang, Singapore (SG); Yong Xiang Lim, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 717 days.

(21) Appl. No.: 17/073,671

(22) Filed: Oct. 19, 2020

(65) Prior Publication Data

US 2022/0122873 A1    Apr. 21, 2022

(51) Int. Cl.
*H01L 21/683*    (2006.01)
*C23C 16/458*    (2006.01)
(Continued)

(52) U.S. Cl.
CPC ...... *H01L 21/6833* (2013.01); *C23C 16/4586* (2013.01); *C23C 16/50* (2013.01);
(Continued)

(58) Field of Classification Search
CPC . C23C 16/4586; C23C 16/50; C23C 16/5096; H01L 21/6833; H01L 21/6838;
(Continued)

(56) References Cited

U.S. PATENT DOCUMENTS 5,459,632 A * 10/1995 Birang ................ H02N 13/00
                                                        307/130
5,886,865 A *  3/1999 Parkhe ................ H02N 13/00
                                                        361/233
(Continued)

FOREIGN PATENT DOCUMENTS

JP    H07-147250 A    6/1995
JP    H09-223729 A    8/1997
(Continued)

OTHER PUBLICATIONS

Machine translation of Jea Korean Patent Document KR 20180078067 A Jul. 9, 2018 (Year: 2018).*

(Continued)

*Primary Examiner* — Kevin J Comber
(74) *Attorney, Agent, or Firm* — Kilpatrick Townsend & Stockton LLP

(57) ABSTRACT

Exemplary semiconductor processing systems include a processing chamber, a power supply, and a chuck disposed at least partially within the processing chamber. The chuck includes a chuck body defining a vacuum port. The chuck also includes first and second coplanar electrodes embedded in the chuck body and connected to the power supply. In some examples, coplanar electrodes include concentric electrodes defining a concentric gap in between. Exemplary semiconductor processing methods may include activating the power supply for the electrostatic chuck to secure a semiconductor substrate on the body of the chuck and/or activating the vacuum port defined by the body of the electrostatic chuck. Some processing can be carried out at (Continued)

increased pressure, while other processing can be carried out at reduced pressure with increased chucking voltage.

20 Claims, 7 Drawing Sheets

(51) Int. Cl.
*C23C 16/50* (2006.01)
*H01J 37/32* (2006.01)
*H01L 21/687* (2006.01)
(52) U.S. Cl.
CPC .. *H01J 37/32715* (2013.01); *H01L 21/68742* (2013.01); *H01J 2237/2007* (2013.01); *H01J 2237/3321* (2013.01)
(58) Field of Classification Search
CPC .......... H01L 21/68742; H01J 37/32715; H01J 2237/2007; H01J 2237/3321
USPC .......................................... 361/234
See application file for complete search history.

(56) References Cited

U.S. PATENT DOCUMENTS

2011/0061810 A1\* 3/2011 Ganguly ............. H01L 21/0223
156/345.27
2015/0331337 A1\* 11/2015 Sundarrajan ........ G03F 7/70733
355/72

FOREIGN PATENT DOCUMENTS

| KR | 2017-0005113 A | 1/2017 | |
| KR | 2018078067 A \* | 7/2018 | ............... B23Q 3/15 |
| WO | 2019-169102 A1 | 9/2019 | |

OTHER PUBLICATIONS

International Search Report and Written Opinion dated Feb. 9, 2022 in International Patent Application No. PCT/US2021/071911, 9 pages.

\* cited by examiner

MULTI-PRESSURE BIPOLAR ELECTROSTATIC CHUCKING

TECHNICAL FIELD

The present technology relates to components and apparatuses for semiconductor manufacturing. More specifically, the present technology relates to electrostatic chucking components and other semiconductor processing equipment.

BACKGROUND

Integrated circuits are made possible by processes that produce intricately patterned material layers on substrate surfaces. Producing patterned material on a substrate requires controlled methods of formation and removal of exposed material. As device sizes continue to shrink, materials deposited may impart stresses on substrates, which may result in bowing of the substrate. During subsequent deposition operations, wafer bow may influence contact across a substrate support, which can affect heating. A non-uniform heating profile across the substrate can affect subsequent deposition operations, causing non-uniform deposition across the surface of the substrate to increase over multiple processing operations.

Thus, there is a need for improved systems and methods that can be used to produce high quality devices and structures in view of the above. These and other needs are addressed by the present technology.

SUMMARY

Exemplary semiconductor processing systems may include a processing chamber, a power supply, and an electrostatic chuck disposed at least partially within the processing chamber. The chuck includes a chuck body defining a vacuum port. The chuck also includes first and second coplanar electrodes embedded in the chuck body and connected to the power supply. In some examples, the coplanar electrodes include semicircular mesh electrodes defining a linear gap in between. In some examples, coplanar electrodes include concentric electrodes defining a concentric gap in between.

In some exemplary semiconductor processing systems, the power supply is configured to be floating relative to ground. In some exemplary semiconductor processing systems, the power supply is configured to selectively reverse the polarity of a chucking voltage to at least one of the electrodes.

Exemplary semiconductor processing methods may include activating a power supply for an electrostatic chuck to secure a semiconductor substrate on the body of the electrostatic chuck and activating a vacuum port defined by the body of the electrostatic chuck. In some examples, voltage is reduced while pressure is increased in the interior of a semiconductor processing chamber. In some examples, sub-atmospheric chemical vapor deposition is carried out at increased pressure. In some examples, pressure is then reduced while increasing the chucking voltage. In some examples, plasma is struck in the interior of the semiconductor processing chamber and plasma-enhanced processing of the semiconductor substrate is carried out.

An exemplary electrostatic chuck may include a chuck body defining a vacuum port and first and second coplanar, concentric electrodes embedded in the chuck body. The coplanar, concentric electrodes define a concentric gap in between. In some examples, the coplanar, concentric electrodes and the concentric gap are coextensive with a majority of a circumference of the chuck body. In some examples, the coplanar, concentric electrodes include at least two concentric sections.

BRIEF DESCRIPTION OF THE DRAWINGS

A further understanding of the nature and advantages of the disclosed technology may be realized by reference to the remaining portions of the specification and the drawings.

Figure 1:
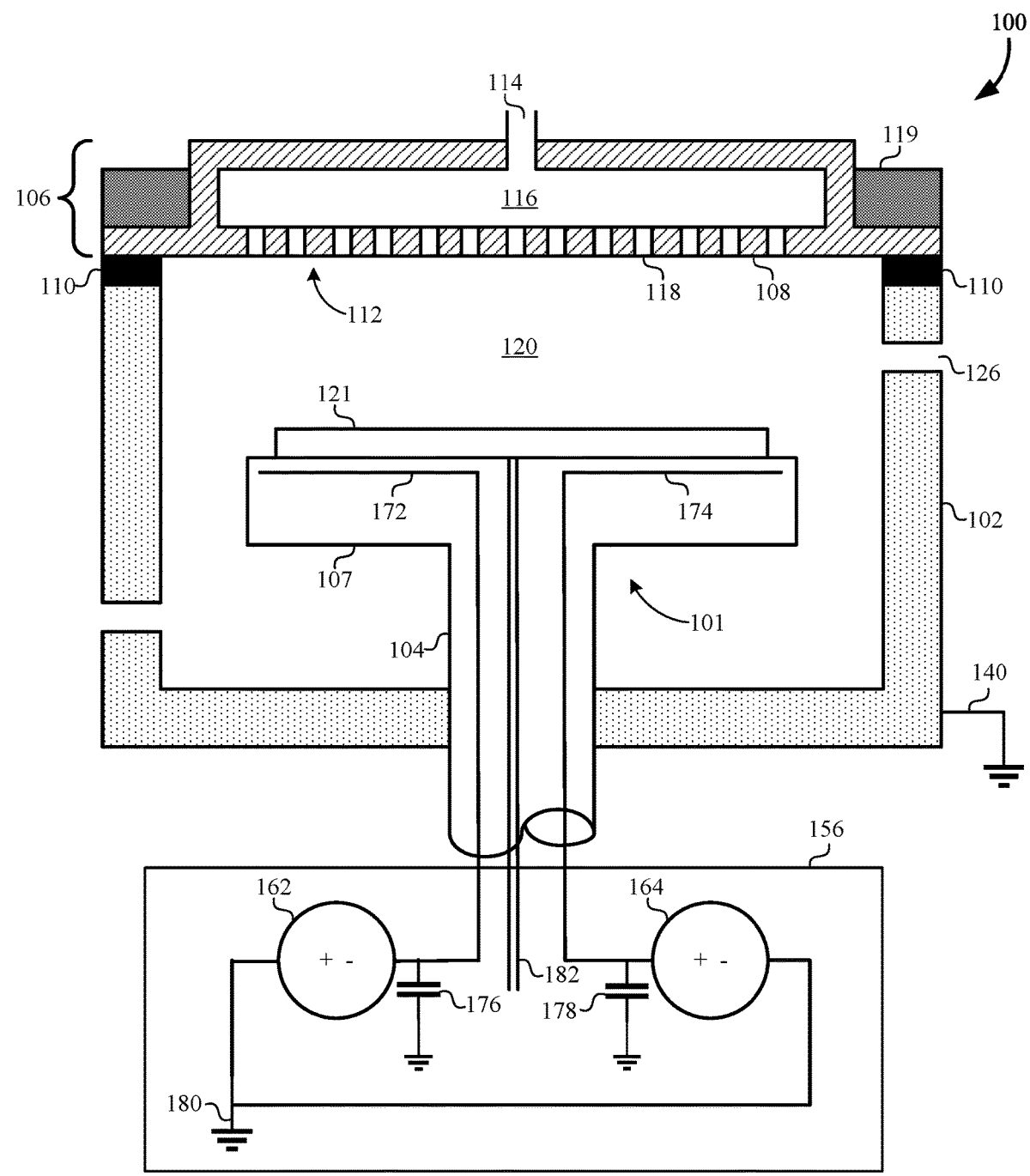
FIG. 1 shows a schematic cross-sectional view of an exemplary semiconductor processing system according to some embodiments of the present technology.

Several of the figures are included as schematics. It is to be understood that the figures are for illustrative purposes, and are not to be considered of scale unless specifically stated to be of scale. Additionally, being schematic in nature, the figures are provided to aid comprehension and may not include all aspects or information compared to realistic representations. The figures may include exaggerated material for illustrative purposes. Similar components and/or features may have the same reference label in different figures.

DETAILED DESCRIPTION

In a variety of processing systems, a substrate support may operate as a heat source and/or a chuck for a substrate during deposition. As fabrication processes are performed, a number of layers of material may be formed over a substrate, which may impart a number of stresses on the substrate. In many instances, these stresses may cause an amount of bowing of the substrate, causing non-uniform deposition across the surface of the substrate to increase over multiple processing operations.

High aspect ratio processing (HARP) typically includes such multiple operations. For example, HARP may include sub-atmospheric chemical vapor deposition (SACVD) and plasma enhanced (PE) processes in order to improve the quality of deposited films. The different kinds of deposition processes typically take place at different pressures and temperatures, presenting challenges to effective chucking of the semiconductor substrate to maintain flatness and stability. Monopolar chucking with an electrostatic chuck (ESC) does not work without plasma being present in the processing chamber to provide charge needed for chucking. Vacuum chucking does not provide enough force to counteract substrate wafer bow during processing at low pressures. Also, with some multi-pressure processes, one type of chucking used alone may not provide enough force to overcome substrate wafer bow and prevent substrate backside deposition and particle accumulation, both of which can increase as multiple processes are carried out.

The present technology overcomes these challenges by utilizing a bipolar ESC that also includes vacuum chucking. Further, the chuck can be operated using methods designed to minimize defects that might otherwise occur in a multi-pressure deposition process, such as defects resulting from loose chucking and/or unwanted electrical discharge. Some embodiments of the present technology also include a power supply with one or more features designed to minimize such defects.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered so limited as to be for use with these specific deposition processes or chambers alone. The disclosure will discuss one possible system and chamber that may include lid stack components according to embodiments of the present technology before additional variations and adjustments to this system according to embodiments of the present technology are described.

FIG. 1 shows a schematic cross-sectional view of an exemplary semiconductor processing system according to some embodiments of the present technology. As shown, the semiconductor processing system 100 may be an etch chamber suitable for etching a substrate 121. The processing system 100 may be used for various plasma processes. For example, the processing system 100 may be used to perform dry etching with one or more etching agents. The processing system may be used for ignition of plasma from a precursor $C_xF_y$ (where x and y represent values for known compounds), $O_2$, $NF_3$, or combinations thereof. In another example, the processing chamber 100 may be used for SACVD.

The system includes a processing chamber having a chamber body 102, an interior 120, a lid assembly 106, and an electrostatic chuck 101. The chamber body is grounded via chamber ground terminal 140. The electrostatic chuck 101 includes support stem 104 and chuck body 107. While a portion of the support stem may protrude from the chamber, the electrostatic chuck is at least partially contained within the processing chamber during processing. The lid assembly 106 is positioned at an upper end of the chamber body 102. The chuck body 107 may be contained inside the chamber body 102, and the lid assembly 106 may be coupled to the chamber body 102 and enclose the chuck body 107 in the processing chamber. The chamber body 102 may include a transfer port 126, which may include a slit valve, formed in a sidewall of the chamber body 102. The transfer port 126 may be selectively opened and closed to allow access to an interior 120 of the processing chamber by a substrate handling robot (not shown) for substrate transfer.

An electrode 108 may be provided as a portion of the lid assembly 106. The electrode 108 may also function as a gas distributor plate 112 having openings 118 for admitting process gas into the interior 120 of the processing chamber. The process gases may be supplied to the processing chamber via a conduit 114, and the process gases may enter a gas-mixing region 116 prior to flowing through the openings 118. The electrode 108 may be coupled to a source of electric power, such as an RF generator (not shown). An isolator 110 may contact the electrode 108 and separate the electrode 108 electrically and thermally from the chamber body 102. The isolator 110 may be constructed using a dielectric material such aluminum oxide, aluminum nitride, and/or other ceramics or metal oxides. A heater 119 may be coupled to the gas distributor plate 112. The heater 119 may also be coupled to an AC power source (not shown).

The chuck 101 may be coupled to a lift mechanism (not shown) through support stem 104, which extends through a bottom surface of the chamber body 102. The lift mechanism may be flexibly sealed to the chamber body 102 by a bellows that prevents vacuum leakage from around the support stem 104. The lift mechanism may allow the support stem 104 to be moved vertically within the chamber body 102 between a transfer position and a number of process positions to place the substrate 121 in proximity to the electrode 108. In typical implementations, one or more pedestal electrodes may be included in the chuck body 107. One or more pedestal electrodes (not shown) may be configured to deliver RF energy to a plasma in the interior 120 of the processing chamber.

The electrostatic chuck 101 is a bipolar electrostatic chuck, configured for supporting and holding a substrate being processed using two electrodes, one usually positive and one usually negative. In one embodiment, the electrostatic chuck 101 comprises electrodes 172 and 174 to which voltage is applied to electrostatically secure a substrate thereon. The electrodes are powered by power supply 156. Power supply 156 includes negative voltage source 162 that supplies power to electrode 172 and a positive voltage source 164 that that supplies power to electrode 174. Power supply 156 includes filter capacitor 176 and filter capacitor 178. Power supply 156 is grounded via power supply ground terminal 180.

Electrodes 172 and 174 of system 100 are pictured schematically. Actual, physical chuck electrodes can take any of various shapes and be arranged in various ways. The electrodes are co-planar and are embedded within the chuck body. The bipolar chuck electrodes are also conductive and may be fashioned from a metallic material. Each of the bipolar chuck electrodes 172 and 174 is biased with an equal and opposite voltage. The electric field established between the bipolar chuck electrodes 172 and 174 induces a charge accumulation on the backside of a substrate that pulls the substrate to the surface of the chuck. Additionally, a gap exists between the bipolar chuck electrodes 172 and 174 to prevent short circuiting of the electrodes During a plasma process, a substrate positioned on an electrostatic chuck may increase in curvature due to deformation from heating, increased thickness of deposited film, loss of chucking power, or the combination thereof. The deformation of the substrate may increase non-uniformity of the process. In one embodiment, flatness of the substrate being processed may be monitored by measuring characteristics of an electrostatic chuck that secures the substrate. Depending upon the predetermined conditions, chucking voltage of the electrostatic chuck may be adjusted to correct substrate deformation. However, in processes where various pressures within the chamber are used, electrostatic chucking alone may be insufficient. In such cases a vacuum port in the surface of chuck body 107 is activated through vacuum line 182. The chucks described herein can include either groves or mesas (not shown) in the top surface above the heater in order to increase available vacuum space.

Figure 2:
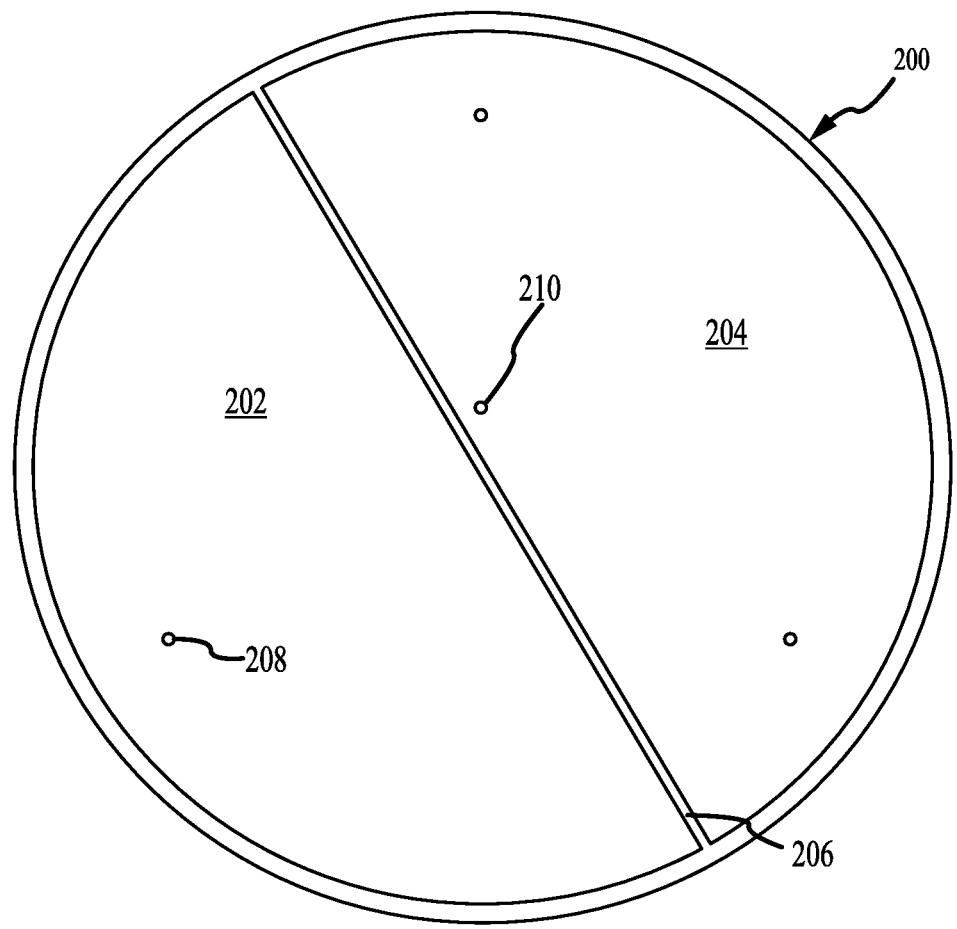
FIG. 2 shows a schematic top plan view of an exemplary electrostatic chuck according to some embodiments of the present technology.

FIG. 2 shows a schematic top plan view of an exemplary electrostatic chuck according to some embodiments of the present technology. Electrostatic chuck body 200 is presented with a see-through top surface and heater so that the chucking electrodes may be observed. Chuck body 200 includes first and second coplanar electrodes 202 and 204. The electrodes define semicircles with linear gap 206 in between. The chuck body 200 further includes lift pins 208 and a vacuum port 210 defined by the body of the electrostatic chuck and at least one of the semicircular electrodes. In some embodiments, the electrodes are composed of metallic mesh. An electrostatic chuck using chuck body 200 can be used with the semiconductor processing system shown in FIG. 1. A vacuum can be created by vacuum line 182 between the vacuum port 310 and a semiconductor substrate resting on chuck body 200.

Figure 3:
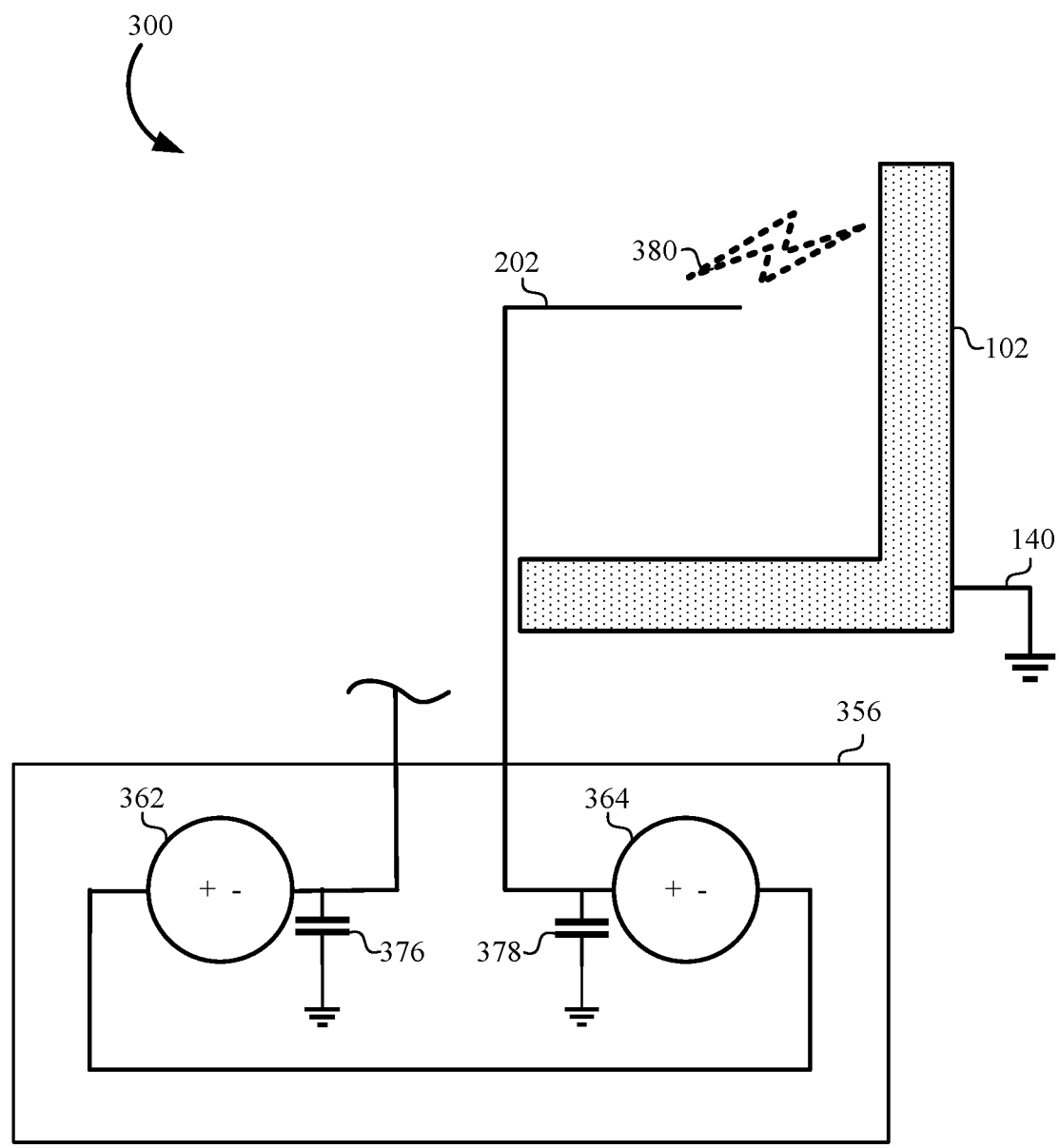
FIG. 3 shows a schematic diagram of a portion of an exemplary semiconductor processing system according to some embodiments of the present technology.

FIG. 3 shows a schematic diagram of a portion of an exemplary semiconductor processing system 300 according to some embodiments of the present technology. System 300 includes an electrostatic chuck with chuck body 200. Electrode 202 is shown. Power supply 356 includes negative voltage source 362 that supplies power to one electrode and a voltage source 364 that supplies power to the other electrode. Power supply 356 includes filter capacitor 376 and filter capacitor 378. Unlike power supply 156, power supply 356 is missing a power supply connection to chamber body ground terminal 140. Power supply 356 therefore floats relative to chamber body ground terminal 140, reducing the risk of DC electric discharge 380 between the chuck electrodes and the chamber body.

Figure 4:
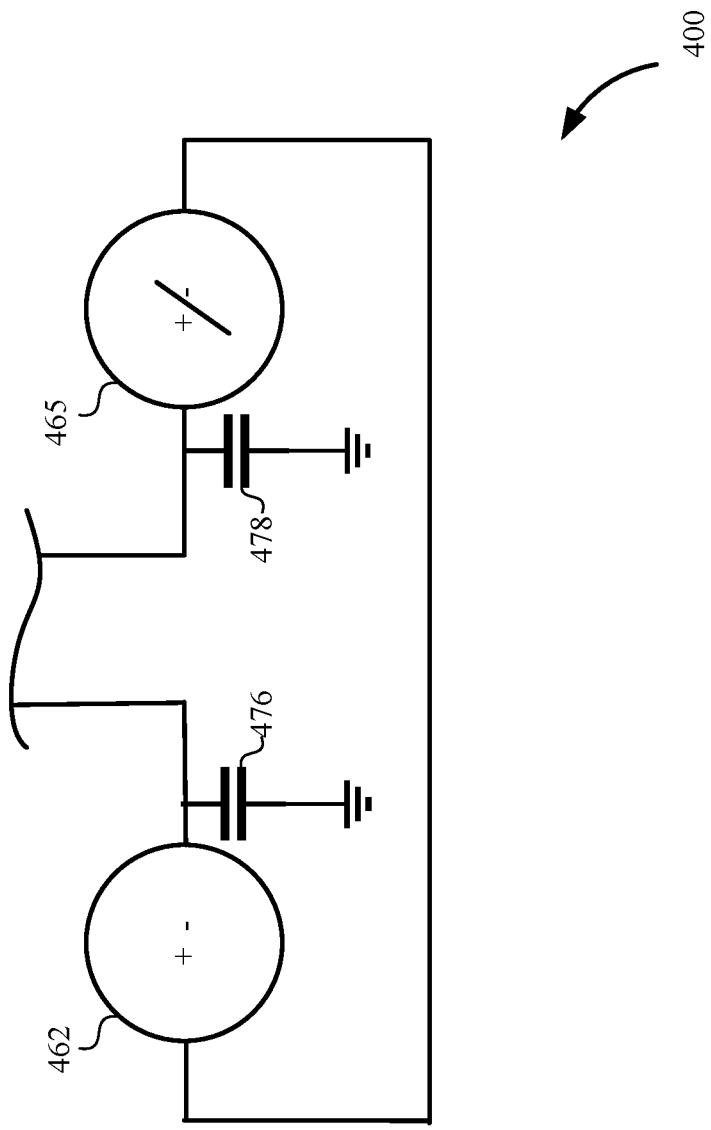
FIG. 4 shows a schematic diagram of an exemplary power supply according to some embodiments of the present technology.

FIG. 4 shows a schematic diagram of an exemplary power supply 400 according to some embodiments of the present technology. Power supply 400 includes negative voltage source 462 that supplies power to one electrode and a voltage source 465 that supplies power to the other electrode. Power supply 400 includes filter capacitor 476 and filter capacitor 478. Power supply 400 is missing a power supply ground terminal and therefore floating in the same manner as power supply 356 of FIG. 3. Additionally, voltage source 465 of power supply 400 in some embodiments is configured to provide selectively reversible polarity. By selectively reversible, what is meant is that the polarity of the electrode connected to voltage source 465 can be switched so that the electrode can be either a cathode or an anode. The polarity can be changed by design at certain times during processing, which can result in more effective chucking. It should be noted that both of these features of power supply 400 are shown together for illustrative purposes only. Either the floating nature of the power supply or the polarity reversing voltage source can be used independently in a system such as semiconductor processing system 100.

Figure 5:
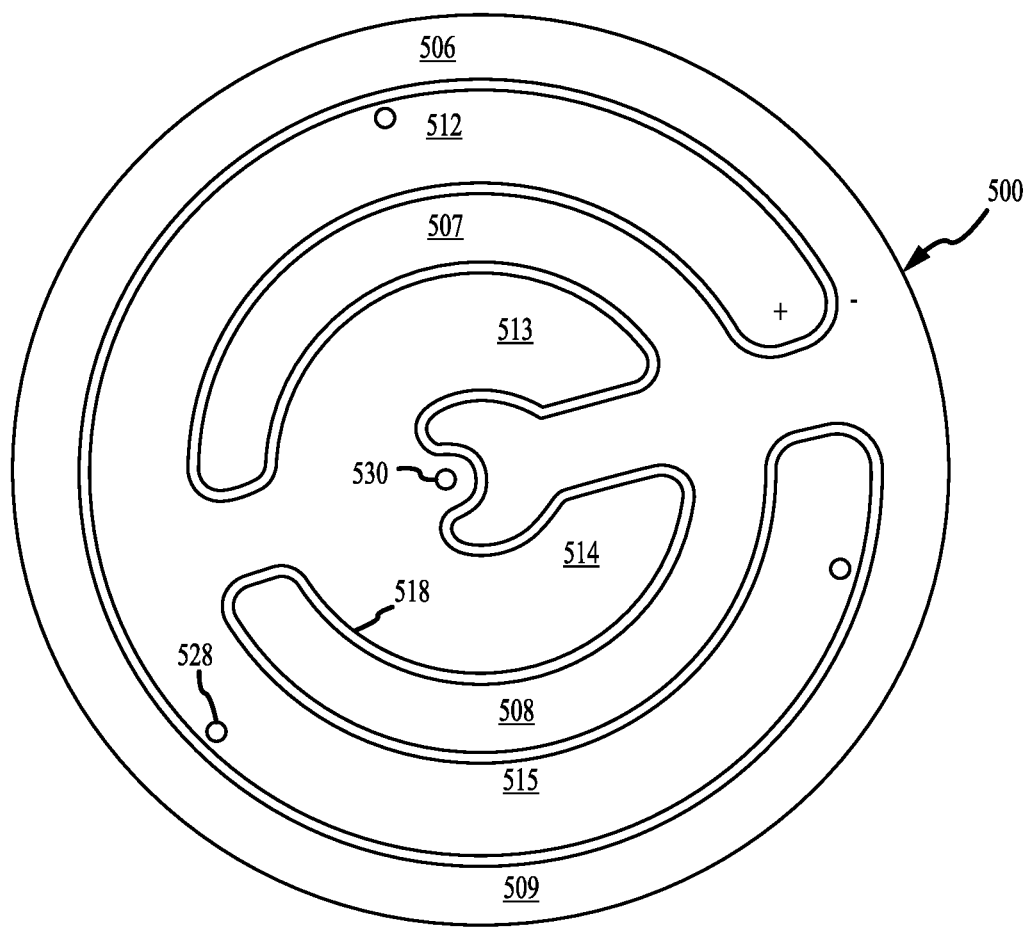
FIG. 5 shows a schematic top plan view of another exemplary electrostatic chuck according to some embodiments of the present technology.

FIG. 5 shows a schematic top plan view of another exemplary electrostatic chuck according to some embodiments of the present technology. Electrostatic chuck body 500 is presented with a see-through top surface and heater so that the electrodes may be observed. Chuck body 500 includes first and second coplanar, concentric electrodes. The electrodes are concentric relative to each other and to the outer edge of the chuck body and are coextensive with a majority of the circumference of the chuck body. Each electrode includes concentric sections. For example, the first electrode includes section 506, section 507, section 508, and section 509. The second electrode includes section 512, section 513, section 514, and section 515. The electrodes are separated from each other by a substantially concentric gap 518 defined between the electrodes. The term concentric is not meant to be absolute. An electrode, section or a gap can be considered concentric if substantial portions form parallel curves; for example, if a majority of the structure forms a parallel curve with other structures or the outer edge of the chuck body.

The chuck body 500 further includes lift pins 528 and one or more vacuum ports 530 defined by the body of the electrostatic chuck and at least one of the electrodes. An electrostatic chuck using chuck body 500 of FIG. 5 can be used with the semiconductor processing system shown in FIG. 1. A vacuum can be created between the vacuum port 530 and a semiconductor substrate resting on chuck body 500. An electrostatic chuck with an electrode configuration like that shown in FIG. 5 can be used to reduce the risk of DC electric discharge since this electrode configuration eliminates the corners exhibited by the electrode configuration shown in FIG. 2. Such a design can also improve uniformity because the outside edge of the substrate is all resting on a single electrode and thus is charged at a single polarity.

In this example of FIG. 5, the electrode with segments closest to the edge of the chuck body is the cathode (−) and the other electrode is the anode (+). Also in this example, if a power supply such as power supply 400 is used, the cathode switches polarity as needed so that both first and second electrodes are positively charged. A chuck with a pair of concentric electrodes can be implemented with any arrangement of polarity for the two electrodes to achieve many of the benefits discussed herein. Having a single voltage polarity at the outside edge of the substrate improves uniformity in addition to reducing discharge risk. Setting a negative voltage polarity for the outside edge can minimize sputtering and inadvertent plasma strike.

Figure 6:
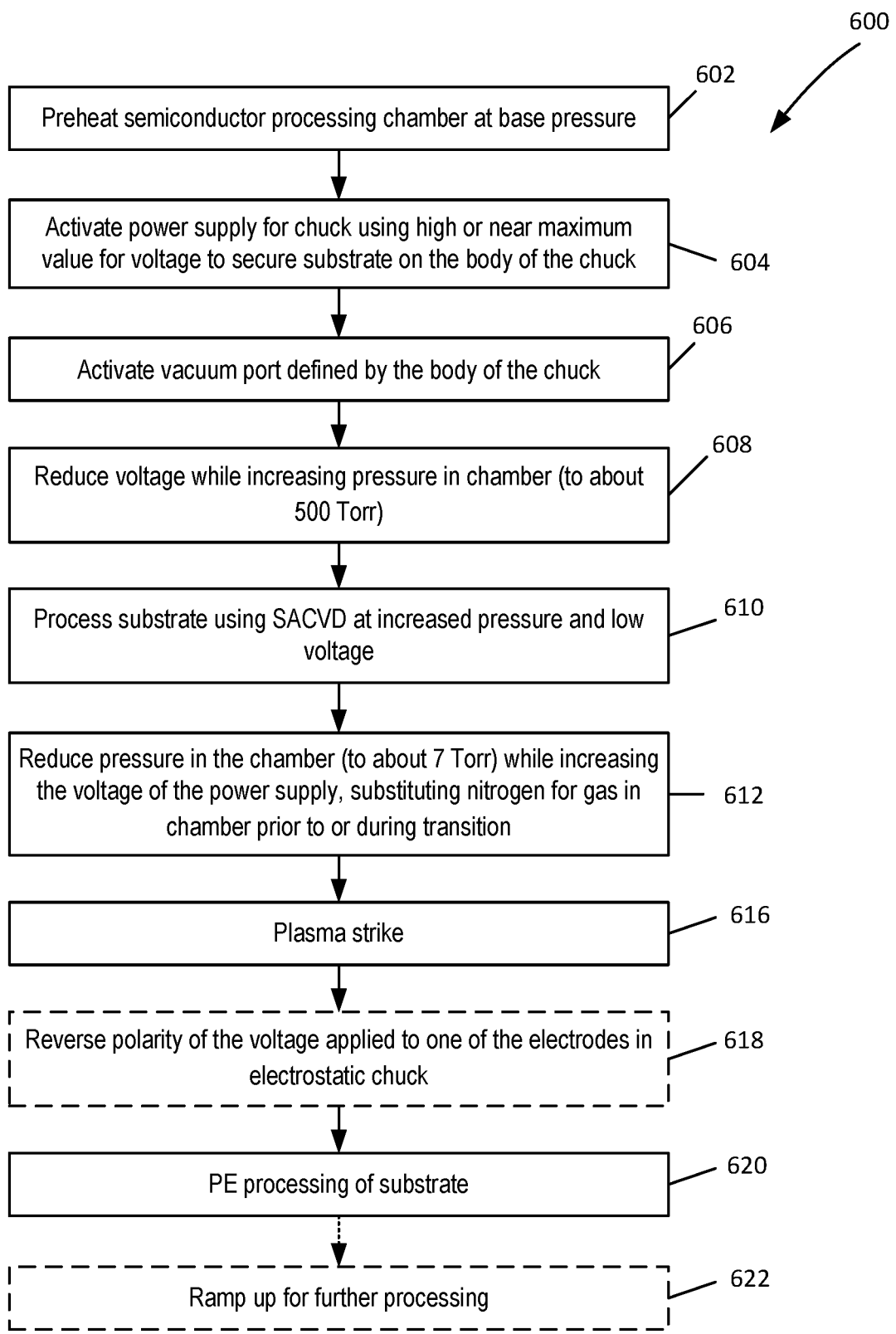
FIG. 6 shows a flowchart of a method for processing a semiconductor substrate according to some embodiments of the present technology.

FIG. 6 shows a flowchart of a method for processing a semiconductor substrate according to some embodiments of the present technology. Method 600 may be performed in one or more chambers, including the chamber previously described herein. Method 600 may make use of one of the electrostatic chucks previously described herein. Method 600 may include a number of optional operations, which may or may not be specifically associated with some embodiments of the present technology. For example, many of the operations are described in order to provide a broader scope of the structures use, but are not critical to the technology, or may be performed by alternative methodology as would be readily appreciated.

In operation 602 of method 600, the processing chamber is preheated at base or ambient pressure. In operation 604, the power supply for the chuck is activated using at or near the maximum value for the power supply voltage in order to secure the substrate on the body of the chuck. By maximum value what is meant is the highest value typically used in the system in question, not necessarily the maximum value available from the power supply. The high chucking voltage, as an example is from 400 V to 800 V. High chucking voltage is needed near the beginning of method 600 because the gap between the substrate and the chuck will be large, for example, 0.5-1.0 mm. In operation 606, the vacuum port defined by the body of the chuck is activated. In operation 608, the voltage supplied to the electrodes of the chuck is reduced while increasing the pressure in the chamber to about 500 Torr. As an example, the pressure during this time can be from 400 Torr to 600 Torr. As an example, the voltage may be from 300 V to 600 V. The chucking voltage can be reduced because at this point the gap between the substrate and the chuck has been closed. Further, vacuum chucking becomes more significant due to the increased pressure. Lowering the voltage reduces the risk of electrical discharge.

Continuing with FIG. 6, in operation 610, the substrate is processed using SACVD at the increased pressure. During this process, the chuck voltage can be further lowered as the chucking assistance provided by the vacuum port should continue. Low voltage, as an example, is from 100 V to 400 V. In operation 612, pressure in the chamber is gradually reduced to about 7 Torr while increasing the voltage of the power supply. As an example, the pressure can be from 4 Torr to 10 Torr. Gas in the chamber can optionally be replaced by nitrogen or another inert gas with a higher breakdown voltage during the transition, and the replacement can be reversed once the desired pressure is reached. The plasma strike takes place in operation 616.

In operation 618, the polarity of the voltage applied to one of the electrodes in the electrostatics chuck can be reversed. In one example, plus and minus voltages are used up to this point in the process, and the polarity of the negative voltage source is switched to positive. The polarity change can be accomplished in part by quickly ramping down the voltage applied to the electrode, and then ramping the voltage up with the opposite polarity. Such a transition would protect the power supply circuitry from surges while avoiding substrate popping. Switching the polarity effectively changes the chuck from bipolar to monopolar, improving uniformity of PE treatment. Plasma enhanced processing takes place in operation 620, and additional processing, including any needed ramp-up of pressure, can optionally begin in operation 622.

Figure 7:
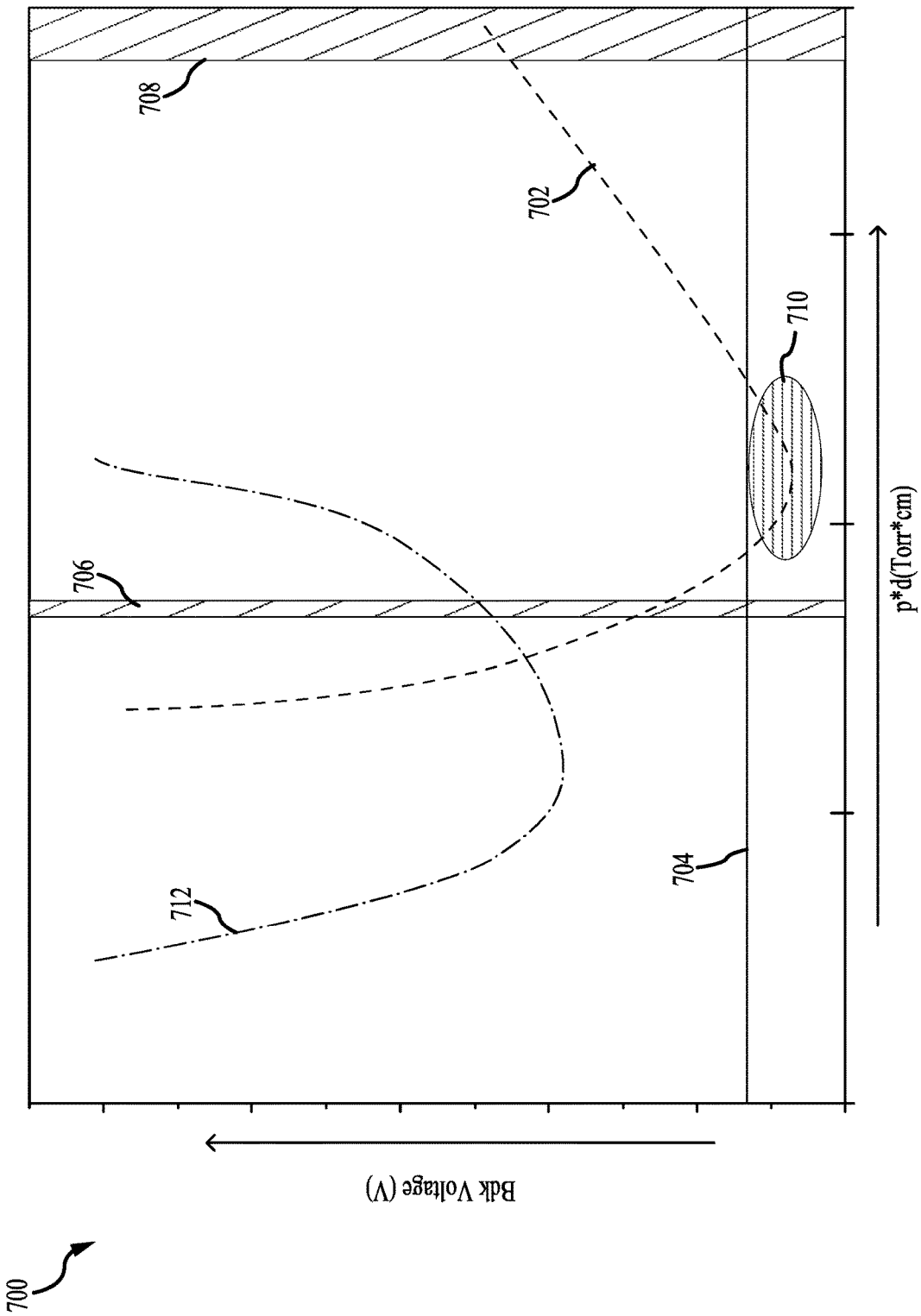
FIG. 7 shows a chart that illustrates the effects using various gasses with different breakdown voltage while processing a semiconductor substrate according to some embodiments of the present technology.

FIG. 7 shows a chart that illustrates the effects using various gasses with different breakdown voltages while processing a semiconductor substrate according to some embodiments of the present technology. Chart 700 shows a breakdown voltage curve 702 of a gas that may be used in a semiconductor processing chamber, such as helium. A typical chuck voltage of between 300 V and 400 V is indicated by line 704. Region 706 of the chart 700 defines an example of a pressure range for PE processing. Region 708 defines an example of a pressure range for SACVD. The gas characterized by curve 702 has a high breakdown voltage in the pressure range used for PE processing and an even higher breakdown voltage in the pressure range for SACVD, however, during the transition between the two pressure ranges, the breakdown voltage of the gas drops below the chuck voltage, resulting in an increased likelihood of DC discharge in region 710. The breakdown voltage of nitrogen is indicated by curve 712. When the gas in the chamber is substantially replaced by nitrogen for transitioning the pressure, the risk of electrical discharge is substantially reduced, as the breakdown voltage of the chamber atmosphere largely follows curve 712.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an electrode" includes a plurality of such electrodes, and reference to "the vacuum port" includes reference to one or more vacuum ports and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups. The words "coupled", "connected", "disposed" and similar terms may refer to a direct connection or placement between components, or a connection or placement with or among intervening components. Terms such as "above", "below", "top", and "bottom" are meant to refer to relative positions when observing the figures in a normal orientation and do not necessarily imply actual positioning in a physical system.

What is claimed is:

1. A semiconductor processing system comprising:
a processing chamber;
a power supply; and
an electrostatic chuck disposed at least partially within the processing chamber, the electrostatic chuck further comprising:
a chuck body defining a vacuum port; and
first and second coplanar electrodes embedded in the chuck body and connected to the power supply, wherein the vacuum port extends from a bottom surface of the chuck body through the second coplanar electrode to a top surface of the chuck body.

2. The semiconductor processing system of claim 1, wherein the first and second coplanar electrodes comprise semicircular mesh electrodes defining a linear gap in between.

3. The semiconductor processing system of claim 1, further comprising a ground terminal connected to the processing chamber.

4. The semiconductor processing system of claim 3, wherein the power supply is configured to be floating relative to ground.

5. The semiconductor processing system of claim 1, wherein the first and second coplanar electrodes comprise concentric electrodes defining a concentric gap in between, wherein the concentric electrodes and the concentric gap are coextensive with a majority of a circumference of the chuck body.

6. The semiconductor processing system of claim 5, wherein each of the concentric electrodes comprises at least two concentric sections.

7. The semiconductor processing system of claim 5, wherein the power supply is configured to selectively reverse a polarity of a chucking voltage to at least one of the concentric electrodes.

8. A method of processing a substrate in a semiconductor substrate, the method comprising:
- activating a power supply for an electrostatic chuck using at or near a maximum value for a voltage of the power supply to secure a semiconductor substrate on a body of the electrostatic chuck;
- activating a vacuum port defined by the body of the electrostatic chuck;
- reducing the voltage while increasing a pressure in an interior of a semiconductor processing chamber that includes the body of the electrostatic chuck and the semiconductor substrate;
- processing a semiconductor substrate disposed on the electrostatic chuck using sub-atmospheric chemical vapor deposition at increased pressure;
- reducing the pressure in the interior of the semiconductor processing chamber while increasing the voltage of the power supply;
- striking plasma in the interior of the semiconductor processing chamber at reduced pressure; and
- performing plasma-enhanced processing of the semiconductor substrate.

9. The method of claim 8 further comprising operating a plurality of lift pins to reduce a spacing between the body of the electrostatic chuck and the semiconductor substrate for at least one of the selective-area chemical vapor deposition or the plasma-enhanced processing.

10. The method of claim 8, wherein the increased pressure is about 500 Torr and the reduced pressure is about 7 Torr.

11. The method of claim 8 further comprising reversing a polarity of the voltage applied to one of a pair of electrodes in the body of the electrostatic chuck prior to the plasma-enhanced processing.

12. The method of claim 11, wherein reversing the polarity further comprises ramping the voltage applied to the one of the pair of electrodes down prior to reversing the polarity and up after reversing the polarity, at a rate sufficient to avoid popping the semiconductor substrate.

13. The method of claim 12, wherein the one of the pair of electrodes comprises a concentric section closest to an outer edge of the body of the electrostatic chuck.

14. The method of claim 8 further comprising replacing gas in the interior of the semiconductor processing chamber with an inert gas having a breakdown voltage higher than the maximum value for the voltage of the power supply when transitioning between pressures.

15. The method of claim 14 wherein the inert gas comprises nitrogen.

16. An electrostatic chuck comprising:
- a chuck body defining a vacuum port, wherein the vacuum port extends from a bottom surface of the chuck body to a top surface of the chuck body; and
- first and second coplanar, concentric electrodes embedded in the chuck body configured to be connected to a power supply, the first and second coplanar, concentric electrodes defining a concentric gap in between, the first concentric electrode comprising first and second concentric sections, and the second concentric electrode comprising first and second concentric sections, wherein:
  - the first concentric section of the first electrode substantially surrounds the first concentric section of the second electrode;
  - the second concentric section of the second electrode substantially surrounds the first concentric section of the first electrode; and
  - the second concentric section of the first electrode substantially surrounds the second concentric section of the second electrode,
- wherein the vacuum port extends through the first concentric section of the second electrode.

17. The electrostatic chuck of claim 16 wherein the first and second coplanar, concentric electrodes and the concentric gap are coextensive with a majority of a circumference of the chuck body.

18. The electrostatic chuck of claim 17, wherein each of the first and second coplanar, concentric electrodes comprises at least two concentric sections.

19. The electrostatic chuck of claim 16, wherein the power supply is configured to selectively reverse a polarity of a chucking voltage to at least one of the first and second coplanar, concentric electrodes.

20. The electrostatic chuck of claim 19, wherein the first and second coplanar, concentric electrodes are configured so that a concentric section closest to an outer edge of the chuck body is operable to selectively reverse the polarity.

* * * * *